(12) United States Patent  (10) Patent No.: US 7,826,259 B2
Lou  (45) Date of Patent: Nov. 2, 2010

(54) STAGGERED STRAM CELL

(75) Inventor: Xiaohua Lou, Bloomington, MN (US)

(73) Assignee: Seagate Technology LLC, Scotts Valley, CA (US)

(*) Notice: Subject to any disclaimer, the term of this patent is extended or adjusted under 35 U.S.C. 154(b) by 123 days.

(21) Appl. No.: 12/361,866

(22) Filed: Jan. 29, 2009

(65) Prior Publication Data

US 2010/0188895 A1   Jul. 29, 2010

(51) Int. Cl.
*G11C 11/02* (2006.01)
(52) U.S. Cl. .................... 365/171; 365/158; 365/173
(58) Field of Classification Search ............... 365/39, 365/44, 55
See application file for complete search history.

(56) References Cited

U.S. PATENT DOCUMENTS

| | | | |
|---|---|---|---|
| 6,643,168 B2 * | 11/2003 | Okazawa | 365/173 |
| 6,714,444 B2 | 3/2004 | Huai | |
| 6,829,161 B2 | 12/2004 | Huai | |
| 6,834,005 B1 | 12/2004 | Parkin | |
| 6,838,740 B2 | 1/2005 | Huai | |
| 6,847,547 B2 | 1/2005 | Albert | |
| 6,888,742 B1 * | 5/2005 | Nguyen et al. | 365/158 |
| 6,933,155 B2 | 8/2005 | Albert | |
| 6,958,927 B1 | 10/2005 | Nguyen | |
| 6,967,863 B2 | 11/2005 | Huai | |
| 6,985,385 B2 | 1/2006 | Nguyen | |
| 6,992,359 B2 | 1/2006 | Nguyen | |
| 7,057,921 B2 | 6/2006 | Valet | |
| 7,088,609 B2 | 8/2006 | Valet | |
| 7,110,287 B2 | 9/2006 | Huai | |
| 7,126,202 B2 | 10/2006 | Huai | |
| 7,161,829 B2 | 1/2007 | Huai | |
| 7,190,611 B2 | 3/2007 | Nguyen | |
| 7,230,845 B1 | 6/2007 | Wang | |
| 7,233,039 B2 | 6/2007 | Huai | |
| 7,241,631 B2 | 7/2007 | Huai | |
| 7,242,045 B2 | 7/2007 | Fujioka | |
| 7,242,048 B2 | 7/2007 | Huai | |
| 7,245,462 B2 | 7/2007 | Huai | |
| 7,369,427 B2 | 5/2008 | Diao | |
| 7,430,135 B2 | 9/2008 | Huai | |
| 7,486,551 B1 | 2/2009 | Li | |
| 7,486,552 B2 | 2/2009 | Apalkov | |
| 7,489,541 B2 | 2/2009 | Pakala | |
| 7,518,835 B2 | 4/2009 | Huai | |
| 7,573,736 B2 * | 8/2009 | Wang et al. | 365/158 |
| 7,576,956 B2 | 8/2009 | Huai | |
| 2009/0050991 A1 | 2/2009 | Nagai | |
| 2009/0302403 A1 | 12/2009 | Nguyen | |

* cited by examiner

*Primary Examiner*—Tan T. Nguyen
(74) *Attorney, Agent, or Firm*—Campbell Nelson Whipps LLC

(57) ABSTRACT

Spin-transfer torque memory having a free magnetic layer having a thickness extending in a out-of-plane direction and extending in a lateral direction in an in-plane direction between a first end portion and an opposing second end portion. A tunneling barrier separates a reference magnetic layer from the first end portion and forms a magnetic tunnel junction. A first electrode is in electrical communication with the reference magnetic layer and a second electrode is in electrical communication with the free magnetic layer second end portion such that current flows from the first electrode to the second electrode and passes through the free magnetic layer in the lateral direction to switch the magnetic tunnel junction between a high resistance state and a low resistance state.

26 Claims, 5 Drawing Sheets

STAGGERED STRAM CELL

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance ($\sim 10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes more severe. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One concern in STRAM design is tradeoff between the size and thermal stability of the STRAM cell. As the STRAM cell decreases in size, the switching current decreases also, however, the thermal stability of the device can deteriorate since it is also proportional to the STRAM cell size.

BRIEF SUMMARY

The present disclosure relates to a spin-transfer torque memory unit with a staggered cell element design. In particular, the present disclosure relates to a spin-transfer torque memory unit that provides a lateral spin torque write to at least a portion of the free magnetic layer of the spin-transfer torque memory unit.

In an embodiment, a spin-transfer torque memory unit includes a free magnetic layer having a thickness extending in an out-of-plane direction and extending in a lateral direction in an in-plane direction between a first end portion and an opposing second end portion. A tunneling barrier separates a reference magnetic layer from the first end portion and forms a magnetic tunnel junction. A first electrode is in electrical communication with the reference magnetic layer and a second electrode is in electrical communication with the free magnetic layer second end portion such that current flows from the first electrode to the second electrode and passes through the free magnetic layer in the lateral direction to switch the magnetic tunnel junction between a high resistance state and a low resistance state.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a spin-transfer torque memory unit with a staggered cell element design. In particular, the present disclosure relates to a spin-transfer torque memory unit that provides a lateral spin torque write to at least a portion of the free magnetic layer of the spin-transfer torque memory unit.

While the present disclosure is not so limited, an appreciation of various aspects of the disclosure will be gained through a discussion of the examples provided below.

Figure 1:
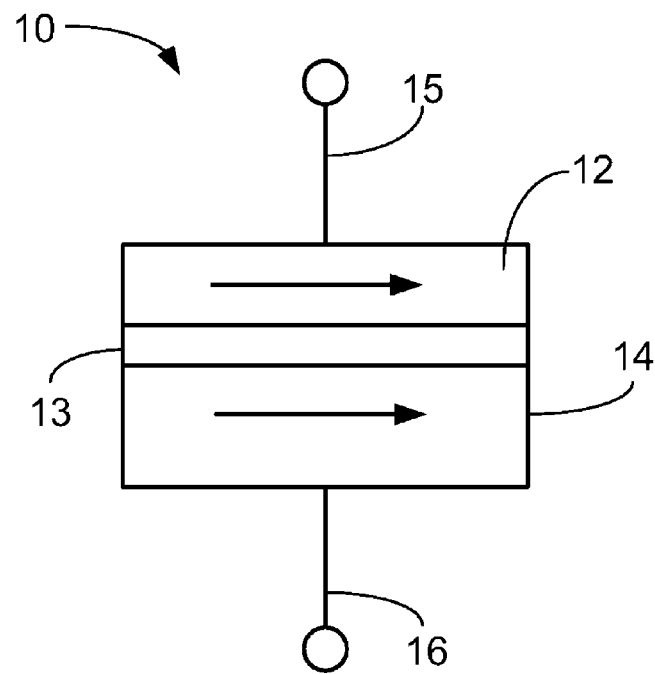
FIG. 1 is a cross-sectional schematic diagram of a magnetic tunneling junction (MTJ) in the low resistance state.
Figure 2:
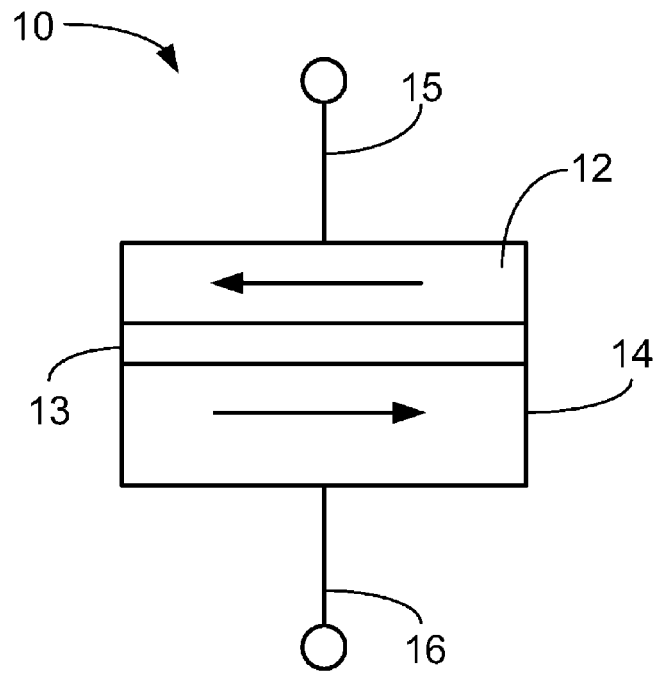
FIG. 2 is a cross-sectional schematic diagram of the MTJ in the high resistance state.

FIG. 1 is a cross-sectional schematic diagram of an illustrative magnetic tunneling junction (MTJ) cell 10 in the low resistance state and FIG. 2 is a cross-sectional schematic diagram of the illustrative MTJ cell 10 in the high resistance state. The MTJ cell can be any memory cell that can switch between a high resistance state and a low resistance state. In many embodiments, the variable resistive memory cell described herein is a spin-transfer torque memory cell.

The MTJ cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunneling barrier layer. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating tunneling barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the MTJ cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the MTJ cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the MTJ cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ cell 10 via spin-transfer occurs when a current, passing through a magnetic layer of the MTJ cell 10, becomes spin polarized and imparts a spin torque on the free layer 12 of the MTJ cell 10. When a sufficient spin torque is applied to the free layer 12, the magnetization orientation of the free layer 12 can be switched between two opposite directions and accordingly the MTJ cell 10 can be switched between the parallel state (i.e., low resistance state or "0" data state) and anti-parallel state (i.e., high resistance state or "1" data state) depending on the direction of the current.

The illustrative spin-transfer torque MTJ cell 10 (and the STRAM cells described below) may be used to construct a memory device that includes multiple variable resistive memory cells where a data bit is stored in magnetic tunnel junction cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3A:
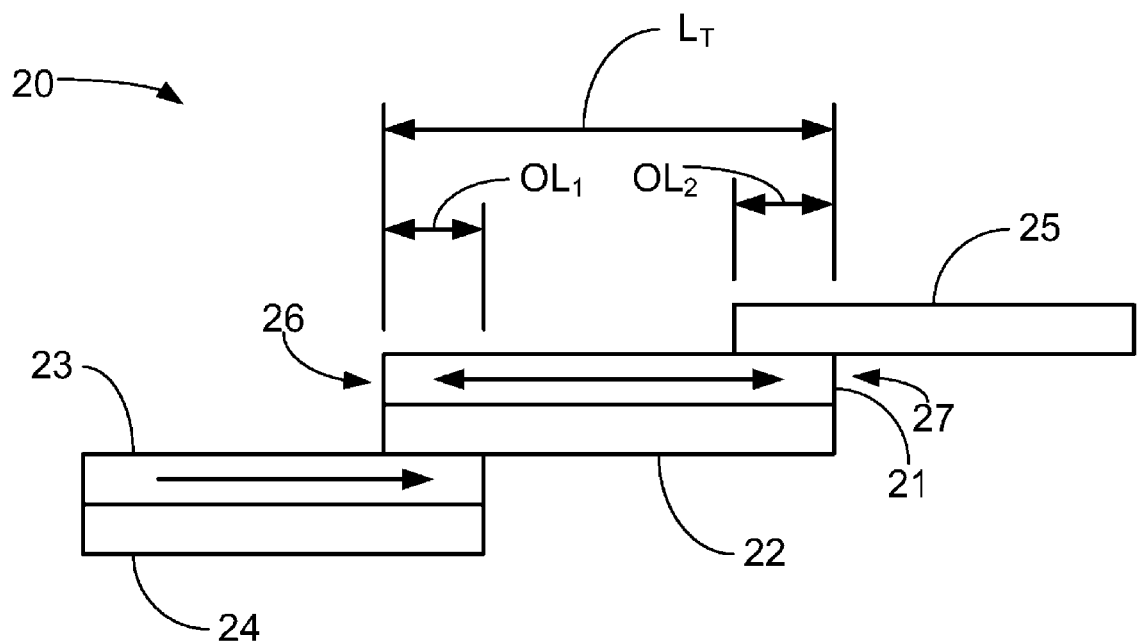
FIG. 3A is a schematic diagram cross-section view of an illustrative spin-transfer torque memory cell having staggered layers.
Figure 3B:
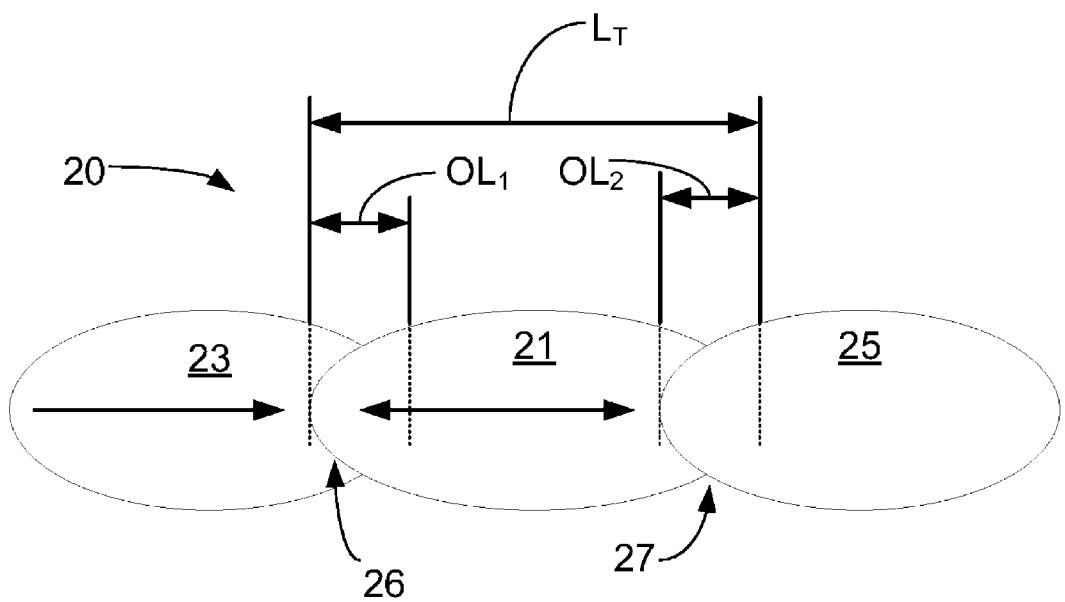
FIG. 3B is a schematic diagram top view of the illustrative spin-transfer torque memory cell shown in FIG. 3A.

FIG. 3A is a schematic diagram cross-section view of an illustrative spin-transfer torque memory cell 20 having staggered layers and FIG. 3B is a schematic diagram top view of the illustrative spin-transfer torque memory cell 20 shown in FIG. 3A. The spin-transfer torque memory cell 20 includes a free magnetic (e.g., ferromagnetic) layer 21 having a thickness extending in an out-of-plane direction. The thickness of the free magnetic layer 21 can be any useful thickness such as, for example, from 1 to 10 nm or from 1 to 5 nm. The free magnetic layer 21 extends in a lateral direction (i.e, length $L_T$) in an in-plane direction between a first end portion 26 and an opposing second end portion 27. The free magnetic layer 21 is formed of any useful ferromagnetic (FM) alloy, as described above. In some embodiments, the free magnetic layer 21 has a length $L_T$ in a range form 100 to 200 nm. The free magnetic layer 21 can have any useful cross-sectional shape along an in-plane direction such as, for example, a rectangular shape, a circular shape, or elliptical shape (as illustrated in FIG. 3B).

A tunneling barrier 22 separates a reference magnetic (e.g., ferromagnetic) layer 23 from the first end portion 26 of the free magnetic layer 21 and forming a magnetic tunnel junction. The thickness of the tunneling barrier 22 can be any useful thickness such as, for example, from 0.5 to 2 nm or from 0.7 to 1.5 nm. The tunneling barrier 22 can be formed of any useful electrically insulating materials, as described above.

The thickness of the reference magnetic layer 23 can be any useful thickness such as, for example, from 1 to 10 nm or from 1 to 5 nm. The reference magnetic layer 23 is formed of any useful ferromagnetic (FM) alloy, as described above. The reference magnetic layer 23 can have any useful cross-sectional shape along an in-plane direction such as, for example, a rectangular shape, a circular shape, or elliptical shape. The reference magnetic layer 23 can be a single ferromagnetic layer, or may include multiple layers, for example, a pair of ferromagnetically coupled ferromagnetic layers, an antiferromagnetic (AFM) pinning layer and a ferromagnetic pinned layer, a synthetic antiferromagnetic (SAF), or an SAF with an antiferromagnetic layer.

The reference magnetic layer 23 and the free magnetic layer 21 form a first overlap portion $OL_1$ where the free magnetic layer 21 overlaps the reference magnetic layer 23 in the out-of-plane direction. The first overlap portion $OL_1$ extends along only a portion of the length $L_T$ of the free magnetic layer 21. In many embodiments, the first overlap portion $OL_1$ is in a range from 1 to 35%, or from 5 to 25%, or from 10 to 25% of the length $L_T$ of the free magnetic layer 21.

A first electrode 24 is in electrical communication with the reference magnetic layer 23. A second electrode 25 is in electrical communication with the free magnetic layer 21 second end portion 27 such that current flows from the first electrode 24 to the second electrode 25 and passes through the free magnetic layer 21 in the lateral direction (i.e., in-plane direction) to switch the magnetic tunnel junction between a high resistance state and a low resistance state (depending on the current direction).

The free magnetic layer 21 and the second electrode 25 form a second overlap portion $OL_2$ where the free magnetic layer 21 overlaps the second electrode 25 in the out-of-plane direction. The second overlap portion $OL_2$ extends along only a portion of the length $L_T$ of the free magnetic layer 21. In many embodiments, the second overlap portion $OL_2$ is in a range from 5 to 35%, or from 5 to 25%, or from 10 to 25% of the length $L_T$ of the free magnetic layer 21. The first overlap portion $OL_1$ and the second overlap portion $OL_1$ are mutually exclusive.

A portion of the free magnetic layer 21 length may not form either the first overlap portion $OL_1$ or the second overlap portion $OL_2$. In many embodiments, the free magnetic layer 21 length that does not form either the first overlap portion $OL_1$ or the second overlap portion $OL_2$ is in a range from 90% to 30%, or from 90% to 50%, or from 80% to 50%.

The resulting spin-transfer torque memory cell 20 forms a staggered structure where at least selected layers of the spin-transfer torque memory cell 20 are not aligned in an out-of-plane direction. In contrast, the MTJ (e.g., spin-transfer torque memory) cell 10 illustrated in FIG. 1 and FIG. 2 have the layers of the memory cell aligned in an out-of-plane direction forming a cylindrical memory cell.

Figure 4:
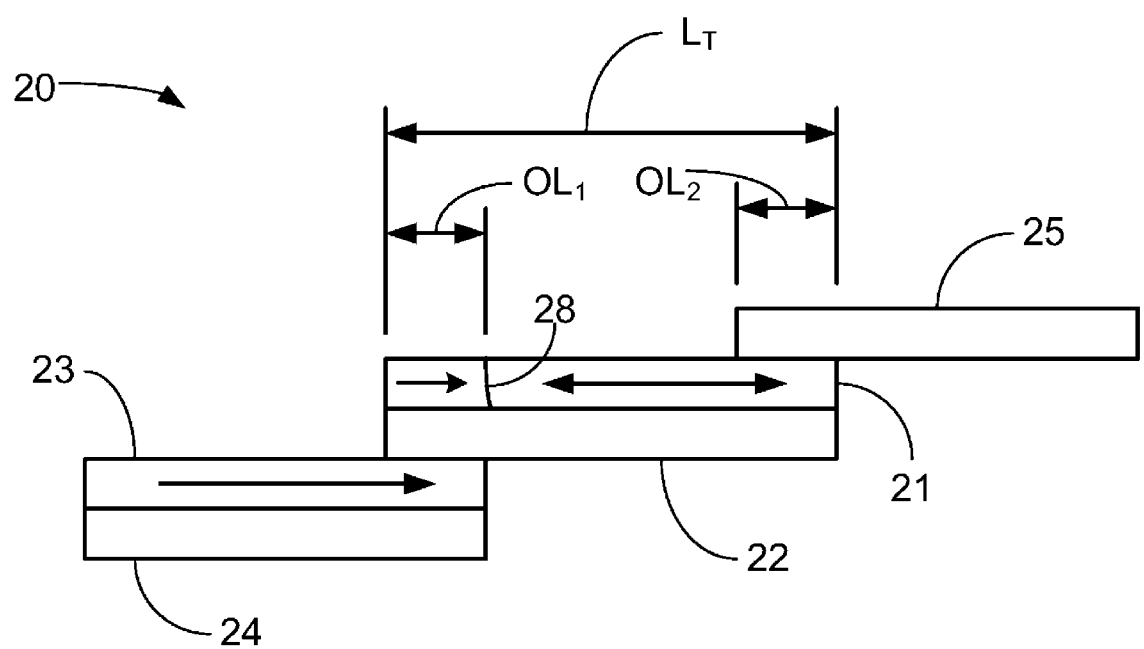
FIG. 4 is a schematic diagram of the illustrative spin-transfer torque memory cell shown in FIG. 3 where an overlap portion of the free layer has switched due to spin-transfer torque from a write current.

FIG. 4 is a schematic diagram of the illustrative spin-transfer torque memory cell 20 shown in FIG. 3A where an overlap portion $OL_1$ of the free magnetic layer 21 has switched due to spin-transfer torque from a write current. The elements shown in FIG. 4 are described in relation to FIG. 3A above.

A write current passing between the first electrode 24 and the second electrode 25 provides spin current tunneling from the reference magnetic layer 23 to re-orient the magnetization orientation of the first overlap portion $OL_1$ of the free magnetic layer 21. Since the first overlap portion $OL_1$ is a fraction of the total free magnetic layer 21 length $L_T$ the required switching current magnitude is also a fraction of what is required if the spin-transfer torque memory cell 20 was not staggered or was aligned as illustrated in FIG. 1 and FIG. 2. For example, if the first overlap portion $OL_1$ is 20% (e.g., 20 nm) of the total free magnetic layer 21 length $L_T$ (e.g., 100 nm), the staggered cell switching current can be about 20% (e.g., 40 µA) of an aligned layer cell (FIG. 1 and FIG. 2) switching current of around 200 µA. Current density at the first overlap portion $OL_1$ is high enough to provide the needed spin current tunneling from the reference magnetic layer 23 to re-orient the magnetization orientation of the first overlap portion $OL_1$ of the free magnetic layer 21. The lower switching current reduces the power requirement for the memory device.

Once the first overlap portion $OL_1$ magnetization orientation has switched due to the spin torque transfer of the switching current, a thin domain wall 28 forms between the first overlap portion $OL_1$ and the remaining portion of the free magnetic layer 21. Due to the lateral, in-plane current path along the length of the free magnetic layer 21, the domain wall 28 moves along the remaining length of the free magnetic layer 21 and switches the magnetization orientation of the remaining length of the free magnetic layer 21. This type of domain wall movement is an effect of spin transfer torque. Completion of this switching is illustrated in FIG. 5.

Figure 5:
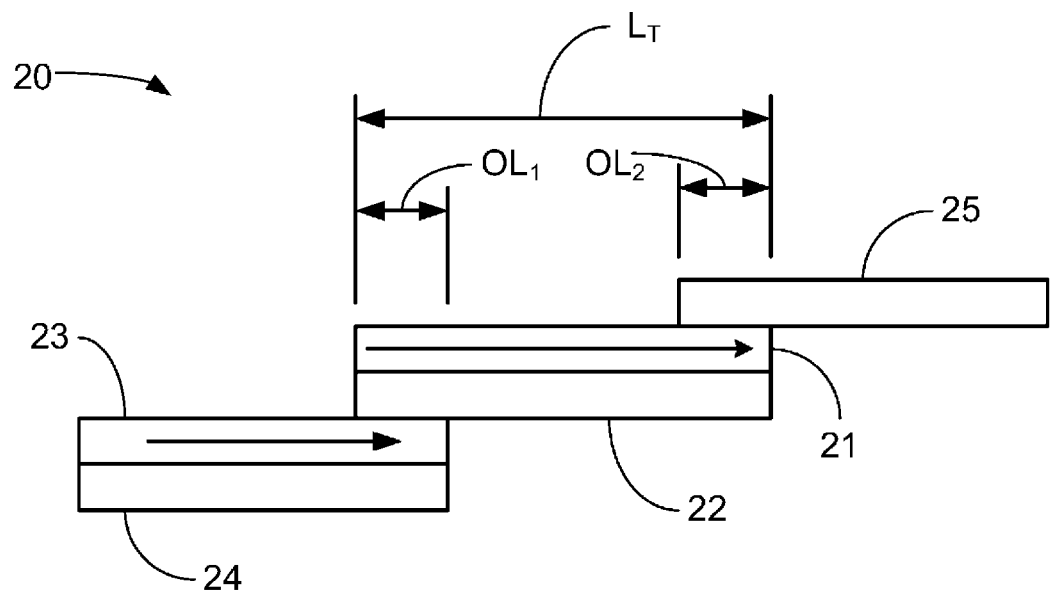
FIG. 5 is a schematic diagram of the illustrative spin-transfer torque memory cell shown in FIG. 3 where the free layer has switched due to spin-transfer torque from a write current.

FIG. 5 is a schematic diagram of the illustrative spin-transfer torque memory cell 20 shown in FIG. 3A where the free layer 21 has switched due to spin-transfer torque from a write current. The elements shown in FIG. 5 are described in relation to FIG. 3A above. The spin-transfer torque memory cell 20 is shown in the low resistance state where the magnetization orientation of the free magnetic layer 21 and the reference magnetic layer 23 are in the parallel configuration, similar to the aligned cell structure of FIG. 1. Reversing the direction of the switching current through the spin-transfer torque memory cell 20 results in the spin-transfer torque memory cell 20 being in the high resistance state where the magnetization orientation of the free magnetic layer 21 and the reference magnetic layer 23 are in the anti-parallel configuration, similar to the aligned cell structure of FIG. 2 in the same spin torque transfer process described in FIG. 4 and FIG. 5 above.

Figure 6:
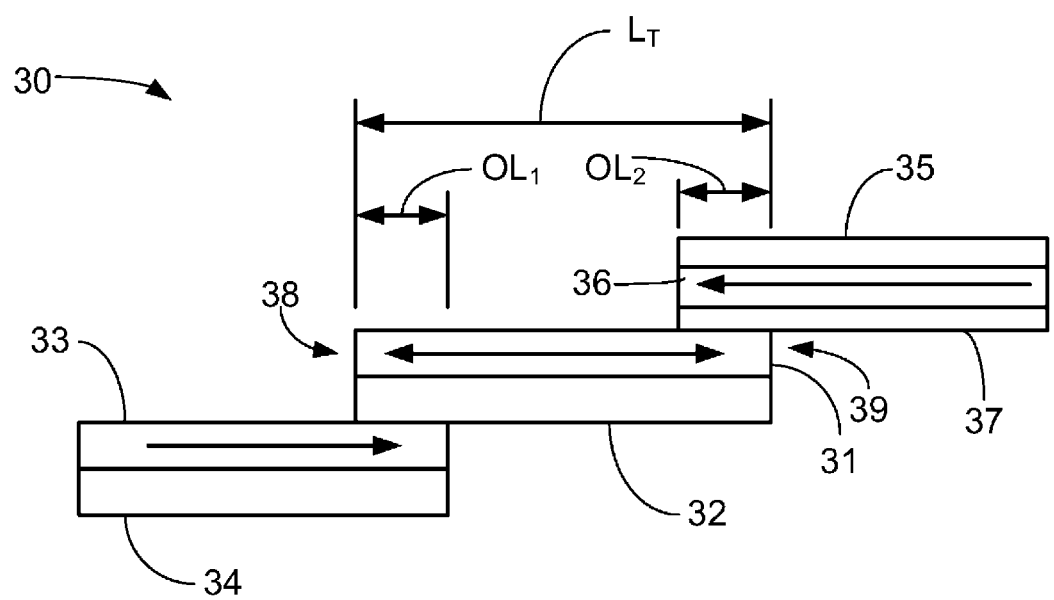
FIG. 6 is a schematic diagram of another illustrative spin-transfer torque memory cell having staggered layers and a second reference magnetic layer.

FIG. 6 is a schematic diagram of another illustrative spin-transfer torque memory cell 30 having staggered layers and a second reference magnetic layer 36. The spin-transfer torque memory cell 30 includes a free magnetic (e.g., ferromagnetic) layer 31 having a thickness extending in an out-of-plane direction. The thickness of the free magnetic layer 31 can be any useful thickness such as, for example, from 1 to 10 nm or from 1 to 5 nm. The free magnetic layer 31 extends in a lateral direction (i.e, length $L_T$) in an in-plane direction between a first end portion 38 and an opposing second end portion 39. The free magnetic layer 31 is formed of any useful ferromagnetic (FM) alloy, as described above. In some embodiments, the free magnetic layer 31 has a length $L_T$ in a range form 100 to 200 nm. The free magnetic layer 31 can have any useful cross-sectional shape along an in-plane direction such as, for example, a rectangular shape, a circular shape, or elliptical shape.

A first tunneling barrier 32 separates a first reference magnetic (e.g., ferromagnetic) layer 33 from the first end portion 38 of the free magnetic layer 31 and forming a magnetic tunnel junction. The thickness of the first tunneling barrier 32 can be any useful thickness such as, for example, from 0.5 to 2 nm or from 0.7 to 1.5 nm. The first tunneling barrier 32 can be formed of any useful electrically insulating materials, as described above.

The thickness of the first reference magnetic layer 33 can be any useful thickness such as, for example, from 1 to 10 nm or from 1 to 5 nm. The first reference magnetic layer 33 is formed of any useful ferromagnetic (FM) alloy, as described above. The first reference magnetic layer 33 can have any useful cross-sectional shape along an in-plane direction such as, for example, a rectangular shape, a circular shape, or elliptical shape. The first reference magnetic layer 33 can be a single ferromagnetic layer, or may include multiple layers, for example, a pair of ferromagnetically coupled ferromagnetic layers, an antiferromagnetic (AFM) pinning layer and a ferromagnetic pinned layer, a synthetic antiferromagentic (SAF), or an SAF with an antiferromagnetic layer.

A second tunneling barrier 37 separates a second reference magnetic (e.g., ferromagnetic) layer 36 from the second end portion 39 of the free magnetic layer 31 and forming a magnetic tunnel junction. The thickness of the second tunneling barrier 37 can be any useful thickness such as, for example, from 0.5 to 2 nm or from 0.7 to 1.5 nm. The second tunneling barrier 37 can be formed of any useful electrically insulating materials, as described above.

While the second tunneling barrier 37 is illustrated as being aligned or co-extensive with the second reference magnetic layer 36 and the first tunneling barrier 32 is illustrated as being aligned or co-extensive with the free magnetic layer 31, the tunneling barriers 32 and 37 can be independently aligned with either or both the free magnetic layer 31 or the reference magnetic layer 36 or 33.

The thickness of the second reference magnetic layer 36 can be any useful thickness such as, for example, from 1 to 10 nm or from 1 to 5 nm. The second reference magnetic layer 36 is formed of any useful ferromagnetic (FM) alloy, as described above. The second reference magnetic layer 36 can have any useful cross-sectional shape along an in-plane direction such as, for example, a rectangular shape, a circular shape, or elliptical shape. The second reference magnetic layer 36 can be a single ferromagnetic layer, or may include multiple layers, for example, a pair of ferromagnetically coupled ferromagnetic layers, an antiferromagnetic (AFM) pinning layer and a ferromagnetic pinned layer, a synthetic antiferromagnetic (SAF), or an SAF with an antiferromagnetic layer. The second reference magnetic layer 36 can have a magnetization orientation that opposes the magnetization orientation of the first reference magnetic layer 33, as illustrated.

The first reference magnetic layer 33 and the free magnetic layer 31 form a first overlap portion $OL_1$ where the free magnetic layer 31 overlaps the first reference magnetic layer 33 in the out-of-plane direction. The first overlap portion $OL_1$ extends along only a portion of the length $L_T$ of the free magnetic layer 31. In many embodiments, the first overlap portion $OL_1$ is in a range from 1 to 35%, or from 5 to 25%, or from 10 to 25% of the length $L_T$ of the free magnetic layer 31.

The second reference magnetic layer 36 and the free magnetic layer 31 form a second overlap portion $OL_2$ where the free magnetic layer 31 overlaps the second reference magnetic layer 36 in the out-of-plane direction. The second overlap portion $OL_2$ extends along only a portion of the length $L_T$ of the free magnetic layer 31. In many embodiments, the second overlap portion $OL_2$ is in a range from 1 to 35%, or from 5 to 25%, or from 10 to 25% of the length $L_T$ of the free magnetic layer 31. The first overlap portion $OL_1$ and the second overlap portion $OL_1$ are mutually exclusive.

A portion of the free magnetic layer 31 length may not form either the first overlap portion $OL_1$ or the second overlap portion $OL_2$. In many embodiments, the free magnetic layer 31 length that does not form either the first overlap portion $OL_1$ or the second overlap portion $OL_2$ is in a range from 90% to 30%, or from 90% to 50%, or from 80% to 50%.

A first electrode 34 is in electrical communication with the first reference magnetic layer 33. A second electrode 35 is in electrical communication with the second reference magnetic layer 33 such that current flows from the first electrode 34 to the second electrode 35 and passes through the free magnetic layer 31 in the lateral direction (i.e., in-plane direction) to switch the magnetic tunnel junction between a high resistance state and a low resistance state (depending on the current direction).

The resulting spin-transfer torque memory cell 30 forms a staggered structure where at least selected layers of the spin-transfer torque memory cell 30 are not aligned in an out-of-plane direction. In contrast, the MTJ (e.g., spin-transfer torque memory) cell 10 illustrated in FIG. 1 and FIG. 2 have the layers of the memory cell aligned in an out-of-plane direction forming a cylindrical memory cell.

Figure 7:
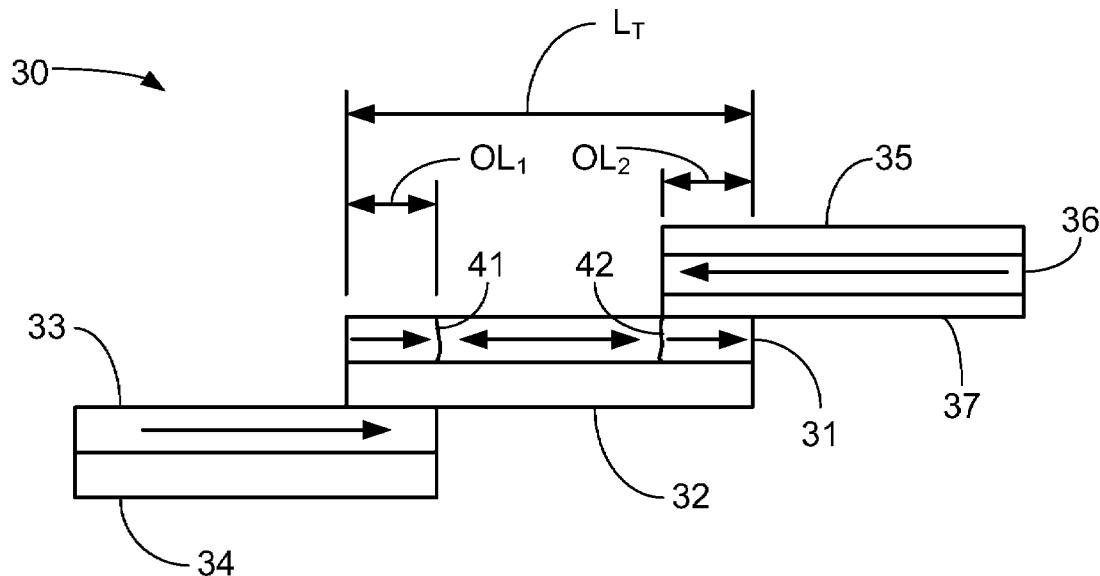
FIG. 7 is a schematic diagram of the illustrative spin-transfer torque memory cell shown in FIG. 6 where an overlap portion of the free layer has switched due to spin-transfer torque from a write current.

FIG. 7 is a schematic diagram of the illustrative spin-transfer torque memory cell 30 shown in FIG. 6 where a first overlap portion $OL_1$ and a second overlap portion $OL_2$ of the free magnetic layer 31 have switched due to spin-transfer torque from a write current. The elements shown in FIG. 7 are described in relation to FIG. 6 above.

A write current passing between the first electrode 34 and the second electrode 35 provides spin current tunneling from the first reference magnetic layer 33 to re-orient the magnetization orientation of the first overlap portion $OL_1$ of the free magnetic layer 31 and provides spin current tunneling from the second reference magnetic layer 36 to re-orient the magnetization orientation of the second overlap portion $OL_2$ of the free magnetic layer 31. Since the first overlap portion $OL_1$ and the second overlap portion $OL_1$ is a fraction of the total free magnetic layer 31 length $L_T$ the required switching current magnitude is also a fraction of what is required if the spin-transfer torque memory cell 30 was not staggered or was aligned as illustrated in FIG. 1 and FIG. 2. For example, if the first overlap portion $OL_1$ or the second overlap portion $OL_1$ is 20% (e.g., 20 nm) of the total free magnetic layer 31 length $L_T$ (e.g., 100 nm), the staggered cell switching current can be about 20% (e.g., 40 μA) of an aligned layer cell (FIG. 1 and FIG. 2) switching current of around 200 μA. Current density at the first overlap portion $OL_1$ and at the second overlap portion $OL_1$ is high enough to provide the needed spin current tunneling from the first reference magnetic layer 33 and the second reference magnetic layer 36 to re-orient the magnetization orientation of the first overlap portion $OL_1$ of the free magnetic layer 21

Once the first overlap portion $OL_1$ magnetization orientation has switched due to the spin torque transfer of the switching current, a first thin domain wall 41 forms between the first overlap portion $OL_1$ and the remaining portion of the free magnetic layer 31. Likewise, once the second overlap portion $OL_2$ magnetization orientation has switched due to the spin torque transfer of the switching current, a second thin domain wall 42 forms between the second overlap portion $OL_2$ and the remaining portion of the free magnetic layer 31. Due to the lateral, in-plane current path along the length of the free magnetic layer 31, the domain walls 41 and 42 moves along the remaining length of the free magnetic layer 31 and towards each other to switch the magnetization orientation of the remaining length of the free magnetic layer 31. This type of domain wall movement is an effect of spin transfer torque. Completion of this switching is illustrated in FIG. 8.

Figure 8:
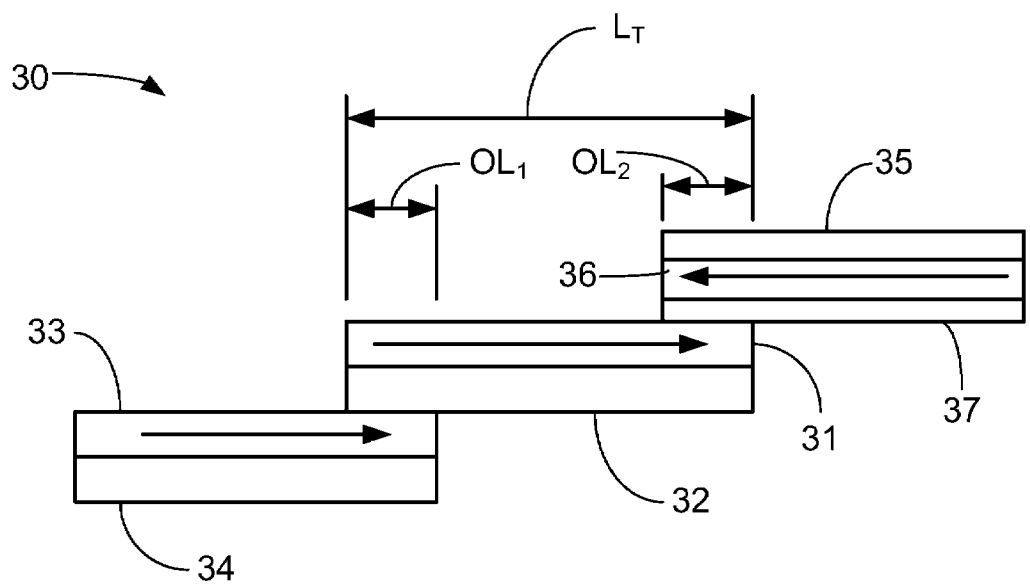
FIG. 8 is a schematic diagram of the illustrative spin-transfer torque memory cell shown in FIG. 6 where the free layer has switched due to spin-transfer torque from a write current.

FIG. 8 is a schematic diagram of the illustrative spin-transfer torque memory cell 30 shown in FIG. 6 where the free layer 31 has switched due to spin-transfer torque from a write current. The elements shown in FIG. 8 are described in relation to FIG. 6 above. The spin-transfer torque memory cell 30 is shown in the low resistance state where the magnetization orientation of the free magnetic layer 31 and the reference magnetic layer 33 are in the parallel configuration, similar to the aligned cell structure of FIG. 1. Reversing the direction of the switching current through the spin-transfer torque memory cell 30 results in the spin-transfer torque memory cell 30 being in the high resistance state where the magnetization orientation of the free magnetic layer 31 and the reference magnetic layer 33 are in the anti-parallel configuration, similar to the aligned cell structure of FIG. 2 in the same spin torque transfer process described in FIG. 7 and FIG. 8 above.

One illustrative advantage of utilizing the dual reference magnetic layers as illustrated in FIGS. 6-8 is that the time to switch the entire free magnetic layer is reduced to about half of the time required for the STRAM cell illustrated in FIGS. 3A-5. An illustrative advantage of the staggered STRAM cells described herein is that the total size of the free magnetic layer allows for increased thermal stability with a decreased switching current requirement as compared to an aligned STRAM cell (illustrated in FIG. 1 and FIG. 2).

The layers of the STRAM cell described above can be deposited utilizing known semiconductor fabrication techniques. The areas around the described layers of the STRAM cell can include electrically insulating materials such as oxides and can also be deposited utilizing known semiconductor fabrication techniques. Electrical connection to memory array circuitry is not illustrated, but it is understood that the described staggered STRAM cells can be incorporated into a memory array utilizing known memory array fabrication techniques.

Thus, embodiments of the STAGGERED STRAM CELL are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A spin-transfer torque memory cell, comprising:
a free magnetic layer having a thickness extending in a out-of-plane direction, the free magnetic layer extending in a lateral direction in an in-plane direction between a first end portion and an opposing second end portion;
a tunneling barrier separates a reference magnetic layer from the first end portion and forming a magnetic tunnel junction;
a first electrode is in electrical communication with the reference magnetic layer;
a second electrode is in electrical communication with the free magnetic layer second end portion such that current flows from the first electrode to the second electrode and passes through the free magnetic layer in the lateral direction to switch the magnetic tunnel junction between a high resistance state and a low resistance state.

2. A spin-transfer torque memory cell according to claim 1, wherein the reference magnetic layer and the free magnetic layer form a first overlap portion where the free magnetic layer overlaps the reference magnetic layer in an out-of-plane direction and the second electrode and the free magnetic layer form a second overlap portion where the free magnetic layer overlaps the second electrode in an out-of-plane direction and the first overlap portion and the second overlap portion are mutually exclusive.

3. A spin-transfer torque memory cell according to claim 2, wherein the first overlap portion is in a range from 1 to 35% of a total lateral distance of the free magnetic layer.

4. A spin-transfer torque memory cell according to claim 2, wherein the second overlap portion is in a range from 1 to 35% of a total lateral distance of the free magnetic layer.

5. A spin-transfer torque memory cell according to claim 2, wherein first overlap portion is in a range from 5 to 25% of a total lateral distance of the free magnetic layer and the second overlap portion is in a range from 5 to 25% of a total lateral distance of the free magnetic layer.

6. A spin-transfer torque memory cell according to claim 1, further comprising a second tunneling barrier separating a second reference magnetic layer from the free magnetic layer, the second reference magnetic layer separating the second electrode from the second tunneling barrier.

7. A spin-transfer torque memory cell according to claim 6, wherein the second reference magnetic layer has a magnetization orientation opposing a magnetization orientation of the reference magnetic layer.

8. A spin-transfer torque memory cell according to claim 6, wherein the second reference magnetic layer and the free magnetic layer form the second overlap portion where the free magnetic layer overlaps the second reference magnetic layer in an out-of-plane direction.

9. A spin-transfer torque memory cell, comprising:
a first electrode;
a reference magnetic layer in electrical connection with the first electrode;
a free magnetic layer overlapping only a portion of the reference magnetic layer in an out-of-plane direction, the free magnetic layer having a thickness extending in a out-of-plane direction and a length extending in a lateral in-plane direction;
a tunneling barrier separates the portion of the reference magnetic layer from the free magnetic layer and forming a magnetic tunnel junction; and
a second electrode in electrical connection with the free magnetic layer and overlapping only a portion of the free magnetic layer in an out-of-plane direction such that current flows from the first electrode to the second electrode and passes through the free magnetic layer in the lateral direction to switch the magnetic tunnel junction between a high resistance state and a low resistance state.

10. A spin-transfer torque memory cell according to claim 9, wherein the reference magnetic layer and the free magnetic layer form a first overlap portion where the free magnetic layer overlaps the reference magnetic layer in an out-of-plane direction and the second electrode and the free magnetic layer form a second overlap portion where the free magnetic layer overlaps the second electrode in an out-of-plane direction and the first overlap portion and the second overlap portion are mutually exclusive.

11. A spin-transfer torque memory cell according to claim 10, wherein the first overlap portion is in a range from 1 to 35% of the length of the free magnetic layer.

12. A spin-transfer torque memory cell according to claim 10, wherein the second overlap portion is in a range from 1 to 35% of the length of the free magnetic layer.

13. A spin-transfer torque memory cell according to claim 10, wherein first overlap portion is in a range from 5 to 25% of the length of the free magnetic layer and the second overlap portion is in a range from 5 to 25% of the length of the free magnetic layer.

14. A spin-transfer torque memory cell according to claim 10, further comprising a second tunneling barrier separating a second reference magnetic layer from the free magnetic layer, the second reference magnetic layer separating the second electrode from the second tunneling barrier.

15. A spin-transfer torque memory cell according to claim 14, wherein the second reference magnetic layer has a magnetization orientation opposing a magnetization orientation of the reference magnetic layer.

16. A spin-transfer torque memory cell according to claim 14, wherein the second reference magnetic layer and the free magnetic layer form the second overlap portion where the free magnetic layer overlaps the second reference magnetic layer in an out-of-plane direction.

17. A spin-transfer torque memory cell, comprising:
a first electrode;
a first reference magnetic layer in electrical connection with the first electrode;
a free magnetic layer overlapping only a portion of the first reference magnetic layer in an out-of-plane direction, the free magnetic layer having a thickness extending in a out-of-plane direction and a length extending in a lateral in-plane direction;
a first tunneling barrier separates the portion of the first reference magnetic layer from the free magnetic layer and forming a magnetic tunnel junction;
a second tunneling barrier separates the free magnetic layer from a second reference magnetic layer, the second reference magnetic layer overlaps only a portion of the free magnetic layer in an out-of-plane direction; and
a second electrode in electrical connection with the reference magnetic layer such that current flows from the first electrode to the second electrode and passes through the free magnetic layer in the lateral direction to switch the magnetic tunnel junction between a high resistance state and a low resistance state.

18. A spin-transfer torque memory cell according to claim 17, wherein the first reference magnetic layer and the free magnetic layer form a first overlap portion where the free magnetic layer overlaps the first reference magnetic layer in an out-of-plane direction and the second reference magnetic layer and the free magnetic layer form a second overlap portion where the free magnetic layer overlaps the second reference magnetic layer in an out-of-plane direction and the first overlap portion and the second overlap portion are mutually exclusive.

19. A spin-transfer torque memory cell according to claim 18, wherein the first overlap portion is in a range from 1 to 35% of the length of the free magnetic layer and the second overlap portion is in a range from 1 to 35% of the length of the free magnetic layer.

20. A spin-transfer torque memory cell according to claim 18, wherein first overlap portion is in a range from 5 to 25% of the length of the free magnetic layer and the second overlap portion is in a range from 5 to 25% of the length of the free magnetic layer.

21. A method comprising:
providing a spin spin-transfer torque memory cell, the spin-tranfer torque memory cell comprising:
a first electrode;
a first reference magnetic layer in electrical connection with the first electrode;
a free magnetic layer overlapping only a portion of the first reference magnetic layer in an out-of-plane direction, forming a first overlapping area, the free magnetic layer having a thickness extending in a out-of-plane direction and a length extending in a lateral in-plane direction;
a first tunneling barrier separates the portion of the first reference magnetic layer from the free magnetic layer and forming a magnetic tunnel junction;
a second tunneling barrier separates the free magnetic layer from a second reference magnetic layer, the second reference magnetic layer overlaps only a portion of the free magnetic layer in an out-of-plane direction forming a second overlapping area; and
a second electrode in electrical connection with the reference magnetic layer;
switching a magnetization orientation of the free magnetic layer first overlapping area and second overlapping area by passing a write current from the first electrode to the second electrode and through the free magnetic layer in the lateral direction, wherein the magnetization orientation of the free magnetic layer first overlapping area and second overlapping area proceeds to switch the magnetization orientation of the entire free magnetic layer.

22. An article, comprising:
a free magnetic layer having a thickness extending in a out-of-plane direction, the free magnetic layer extending in a lateral direction in an in-plane direction between a first end portion and an opposing second end portion;
a tunneling barrier separates a reference magnetic layer from the first end portion and forming a magnetic tunnel junction;
a first electrode is in electrical communication with the reference magnetic layer;
a second electrode is in electrical communication with the free magnetic layer second end portion such that current flows from the first electrode to the second electrode and passes through the free magnetic layer in the lateral direction to switch the magnetic tunnel junction between a high resistance state and a low resistance state.

23. An article according to claim 22, wherein the reference magnetic layer and the free magnetic layer form a first overlap portion where the free magnetic layer overlaps the reference magnetic layer in an out-of-plane direction and the second electrode and the free magnetic layer form a second overlap portion where the free magnetic layer overlaps the second electrode in an out-of-plane direction and the first overlap portion and the second overlap portion are mutually exclusive.

24. An article according to claim 23, wherein the first overlap portion is in a range from 5 to 25% of a total lateral distance of the free magnetic layer.

25. An article according to claim 24, wherein the second overlap portion is in a range from 5 to 25% of a total lateral distance of the free magnetic layer.

26. An article according to claim 22, further comprising a second tunneling barrier separating a second reference magnetic layer from the free magnetic layer, the second reference magnetic layer separating the second electrode from the second tunneling barrier.

* * * * *